(12) United States Patent
Sung et al.

(10) Patent No.: US 12,457,827 B2
(45) Date of Patent: Oct. 28, 2025

(54) DISPLAY DEVICE AND METHOD OF MANUFACTURING THE SAME

(71) Applicant: Samsung Display Co., LTD., Yongin-si (KR)

(72) Inventors: Hyunah Sung, Suwon-si (KR); Taewook Kang, Seongnam-si (KR); Gyungmin Baek, Yongin-si (KR); Shin Il Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 594 days.

(21) Appl. No.: 17/870,372

(22) Filed: Jul. 21, 2022

(65) Prior Publication Data

US 2023/0027414 A1 Jan. 26, 2023

(30) Foreign Application Priority Data

Jul. 23, 2021 (KR) .......................... 10-2021-0097228

(51) Int. Cl.
*H10H 20/832* (2025.01)
*H10H 20/01* (2025.01)
(Continued)

(52) U.S. Cl.
CPC .......... *H10H 20/835* (2025.01); *H10H 20/01* (2025.01); *H10H 20/8312* (2025.01);
(Continued)

(58) Field of Classification Search
CPC ............... H10H 20/835; H10H 20/833; H10H 20/8312; H10H 20/857; H10H 20/01; H10H 20/032
(Continued)

(56) References Cited

U.S. PATENT DOCUMENTS

2006/0108919 A1 5/2006 Kobayashi
2015/0008397 A1* 1/2015 Kim .................... H10K 59/1213
257/40
(Continued)

FOREIGN PATENT DOCUMENTS

KR 10-2006-0056849 A 5/2006
KR 10-2007-0037791 4/2007
(Continued)

*Primary Examiner* — Tu-Tu V Ho
(74) *Attorney, Agent, or Firm* — Innovation Counsel LLP

(57) ABSTRACT

A display device includes a substrate with a display area and a non-display area adjacent to the display area, a transistor disposed in the display area of the substrate and on the substrate, a reflective electrode disposed on the transistor and electrically connected to the transistor, the reflective electrode including molybdenum (Mo), an insulating film disposed on the reflective electrode and including at least one thin film layer, the at least one thin film layer including a first thin film including a material having a refractive index of about 2.0 or more, and a second thin film disposed on the first thin film and including a material having a refractive index of about 1.8 or less, a contact electrode disposed on the insulating film and electrically connected to the reflective electrode and a light emitting diode disposed on the insulating film and electrically connected to the contact electrode.

20 Claims, 14 Drawing Sheets

(51) Int. Cl.
  *H10H 20/831* (2025.01)
  *H10H 20/833* (2025.01)
  *H10H 20/857* (2025.01)

(52) U.S. Cl.
  CPC ........ *H10H 20/833* (2025.01); *H10H 20/857* (2025.01); *H10H 20/032* (2025.01)

(58) Field of Classification Search
  USPC .......................................................... 257/79
  See application file for complete search history.

(56) References Cited

U.S. PATENT DOCUMENTS

| | | | |
|---|---|---|---|
| 2015/0311245 A1* | 10/2015 | Yamazaki | H01L 27/14612 |
| | | | 257/43 |
| 2021/0134877 A1 | 5/2021 | Kim et al. | |
| 2021/0167050 A1 | 6/2021 | Cho et al. | |
| 2021/0342423 A1* | 11/2021 | Yoneda | G06F 21/31 |
| 2021/0391380 A1 | 12/2021 | Li et al. | |
| 2022/0077420 A1 | 3/2022 | Baek et al. | |

FOREIGN PATENT DOCUMENTS

| | | |
|---|---|---|
| KR | 10-2017-0080855 | 7/2017 |
| KR | 10-2020-0021014 A | 2/2020 |
| KR | 10-2020-0041429 A | 4/2020 |
| KR | 10-2020-0077671 | 7/2020 |
| KR | 10-2021-0054117 A | 5/2021 |

* cited by examiner

DISPLAY DEVICE AND METHOD OF MANUFACTURING THE SAME

CROSS-REFERENCE TO RELATED APPLICATION(S)

This application claims priority to and the benefit of Korean Patent Application No. 10-2021-0097228 under 35 USC § 119, filed on Jul. 23, 2021, in the Korean Intellectual Property Office (KIPO), the entire disclosure of which is incorporated by reference herein.

BACKGROUND

1. Technical Field

Embodiments relate to a display device and a method of manufacturing the same.

2. Description of the Related Art

A display device includes a display panel such as an organic light emitting display panel or a liquid crystal display panel. Among them, the light emitting display panel may include a light emitting diode. For example, a light emitting diode (LED) may include an organic light emitting diode (OLED) using an organic material as a fluorescent material and an inorganic light emitting diode using an inorganic material as a fluorescent material.

Inorganic light emitting diode using an inorganic semiconductor as a fluorescent material has durability even in a high temperature environment and has higher blue light efficiency than that of organic light emitting diodes. Research on inorganic light emitting diodes having superior durability and efficiency compared to the organic light emitting diodes is continuing.

Recently, a technique for manufacturing an ultra-small light emitting diode using a highly reliable material and manufacturing a light emitting device using the light emitting diode has been developed. For example, a technology for manufacturing multiple ultra-small light emitting diodes having a size as small as a nano-scale to a micro-scale and configuring a light source of various light emitting devices such as pixels of a display device using ultra-small light emitting devices is being developed.

Such a display device includes a reflective electrode that reflects light emitted from light emitting diodes. A reflectance and chemical resistance of the reflective electrode are problematic.

SUMMARY

Embodiments provide a display device with improved luminous efficiency.

Other embodiments provide a method of manufacturing the display device.

A display device according to an embodiment may include a substrate including a display area and a non-display area adjacent to the display area, a transistor disposed in the display area of the substrate and on the substrate, a reflective electrode disposed on the transistor and electrically connected to the transistor, the reflective electrode including molybdenum (Mo), an insulating film disposed on the reflective electrode and including at least one thin film layer, the at least one thin film layer including a first thin film including a material having a refractive index of about 2.0 or more, and a second thin film disposed on the first thin film and including a material having a refractive index of about 1.8 or less, a contact electrode disposed on the insulating film and electrically connected to the reflective electrode, and a light emitting diode disposed on the insulating film and electrically connected to the contact electrode.

In an embodiment, the first thin film may include at least one of niobium pentoxide ($Nb_2O_5$), titanium dioxide ($TiO_2$), and zirconium dioxide ($ZrO_2$).

In an embodiment, the second thin film may include at least one of aluminum oxide ($Al_2O_3$) and magnesium fluoride ($MgF_2$).

In an embodiment, the at least one thin film may include at least five thin film layers, and the insulating film may include the at least five thin film layers stacked each other.

In an embodiment, a thickness of the first thin film may be less than about 1000 Å, and a thickness of the second thin film may be in a range of about 200 Å and about 800 Å.

In an embodiment, a thickness of the reflective electrode may be in a range of about 500 Å and about 4000 Å.

In an embodiment, the contact electrode may include at least one of indium tin oxide (ITO), indium zinc oxide (IZO), and indium tin zinc oxide (ITZO).

In an embodiment, the display device may further include a pad disposed in the non-display area of the substrate and on the substrate.

In an embodiment, the pad may include a first pad electrode including molybdenum and a second pad electrode covering the first pad electrode and disposed on the first pad electrode.

In an embodiment, the first pad electrode and the reflective electrode may include a same material.

In an embodiment, the second pad electrode and the contact electrode may include a same material.

In an embodiment, the contact electrode may include a first contact electrode and a second contact electrode spaced apart from the first contact electrode, and the light emitting diode may be disposed between the first contact electrode and the second contact electrode.

In an embodiment, the display device may further include an insulation pattern disposed on the light emitting diode, and the insulation pattern may be disposed between the first contact electrode and the second contact electrode.

A method of manufacturing a display device according to an embodiment may include providing a substrate including a display area and a non-display area adjacent to the display area, forming a transistor on the substrate and in the display area of the substrate, forming a reflective electrode on the transistor, the reflective electrode electrically connecting with the transistor, and including molybdenum (Mo), forming an insulating film on the reflective electrode by stacking at least one thin film layer, the at least one thin film layer including a first thin film including a material having a refractive index of about 2.0 or more, and a second thin film formed on the first thin film and including a material having a refractive index of about 1.8 or less, forming a light emitting diode on the insulating film and forming a contact electrode on the second thin film, the contact electrode electrically connecting with the reflective electrode and the light emitting diode.

In an embodiment, the first thin film may include at least one of niobium pentoxide ($Nb_2O_5$), titanium dioxide ($TiO_2$), and zirconium dioxide ($ZrO_2$).

In an embodiment, the second thin film may include at least one of aluminum oxide ($Al_2O_3$) and magnesium fluoride ($MgF_2$).

In an embodiment, the first thin film and the second thin film may be formed by a sputtering method.

In an embodiment, a thickness of the first thin film may be less than about 1000 Å, and a thickness of the second thin film may be in a range of about 200 Å and about 800 Å.

In an embodiment, the method may further include forming a first pad electrode on the substrate and in the non-display area of the substrate and forming a second pad electrode on the first pad electrode.

In an embodiment, the first pad electrode and the reflective electrode may be formed simultaneously, and the second pad electrode and the contact electrode may be formed simultaneously.

In a display device according to embodiments of the disclosure, the reflective electrode may include molybdenum and the insulating film may have a structure with a first thin film having a relatively high refractive index and a second thin film having a relatively low refractive index alternately are stacked with five or more layers. Accordingly, contact resistance between the reflective electrode and the contact electrode may be improved, and corrosion in the reflective electrode and the contact electrode may be reduced. Thus, the chemical resistance of the reflective electrode may be improved.

In addition, due to the stacked structure of the high refractive index thin film and the low refractive index thin film of the insulating film, a luminous efficiency of the display device may be improved, and a display quality of the display device may be improved.

DETAILED DESCRIPTION OF THE EMBODIMENTS

Figure 1:
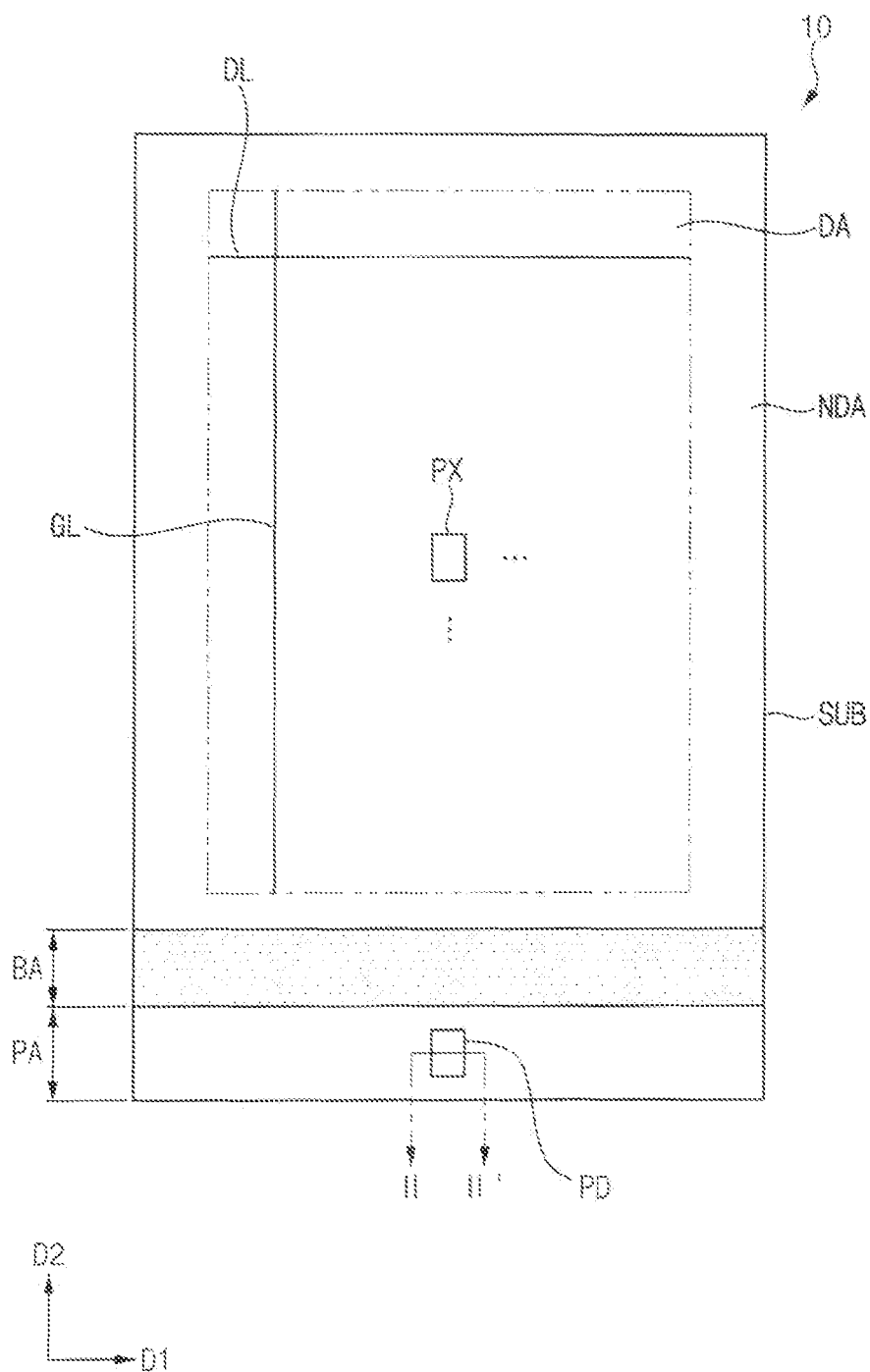
FIG. 1 is a plan view illustrating a display device according to an embodiment.

Hereinafter, display devices in accordance with embodiments will be described in more detail with reference to the accompanying drawings. The same reference numerals are used for the same components in the drawings, and redundant descriptions of the same components will be omitted.

FIG. 1 is a plan view illustrating a display device according to an embodiment.

Referring to FIG. 1, a display device 10 may include a substrate SUB including a display area DA and a non-display area NDA. The display area DA may be an area in which an image is displayed, and the non-display area NDA may be located around the display area DA. The non-display area NDA may surround at least a portion of the display area DA. The non-display area NDA may include drivers that provide control signals to pixels PX and pads PD that provides signals to the pixels PX and is connected to an integrated circuit, a printed circuit board, or the like.

The non-display area NDA may include the pixels PX, the data line DL, and the gate line GL connected to the pixels PX. The pixels PX may include a transistor and a light emitting diode. The data line DL may be electrically connected to a data driver and may extend in a first direction D1. The gate line GL may be connected to the gate driver and may extend in a second direction D2.

The non-display area NDA may further include a bending area BA and a pad area PA. The pad area PA may be, for example, disposed along a short side of the display area DA. However, the disclosure is not limited thereto, and the pad area PA may be disposed along both short sides of the display area DA or along both short sides and both long sides of the display area DA. The bending area BA may be disposed between the display area DA and the pad area PA. The bending area BA may bend.

The drivers may be disposed in the non-display area NDA. Multiple pads PD may be disposed in the pad area PA. The pads PD may receive an external signal for emitting light from the light emitting diode. Also, the pads PD may transmit an external signal to the light emitting diode. Wires connecting the pixels PX and the pads PD may be disposed in the bending area BA.

Figure 2:
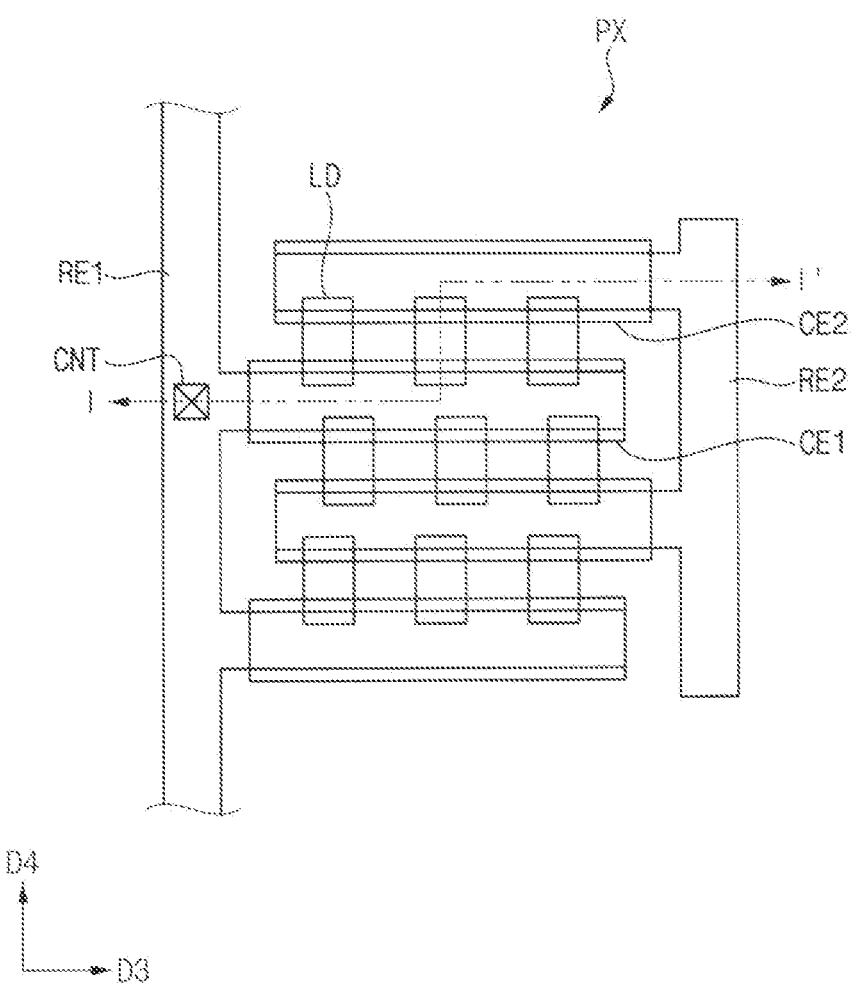
FIG. 2 is a plan view illustrating an arrangement of some components in one pixel included in the display device of FIG. 1.

FIG. 2 is a plan view illustrating an arrangement of some components in one pixel included in the display device of FIG. 1.

Referring to FIGS. 1 and 2, the pixel PX may include a contact electrode CE, a reflective electrode RE, and at least one light emitting diode LD. For example, the pixel PX may include multiple light emitting diodes LD. The contact electrode CE may include a first contact electrode CE1 and a second contact electrode CE2 spaced apart from the first contact electrode CE1. The reflective electrode RE may include a first reflective electrode RE1 and a second reflective electrode RE2 spaced apart from the first reflective electrode RE1.

The contact electrode CE may be disposed on the reflective electrode RE. For example, the first contact electrode CE1 may be disposed on the first reflective electrode RE1. The second contact electrode CE2 may be disposed on the second reflective electrode RE2.

The light emitting diodes LD may be disposed between the first reflective electrode RE1 and the second reflective electrode RE2, and may be disposed between the first contact electrode CE1 and the second contact electrode CE2. Both ends of the light emitting diodes LD may overlap the first contact electrode CE1 and the second contact electrode CE2, respectively. Also, both ends of the light emitting diodes LD may overlap the first reflective electrode RE1 and the second reflective electrode RE2.

The first reflective electrode RE1 and the second reflective electrode RE2 may be spaced apart from each other by a predetermined distance in a third direction D3 and disposed side by side. The first contact electrode CE1 and the second contact electrode CE2 may be spaced apart from each other by a predetermined distance in a fourth direction D4 and disposed side by side.

The first reflective electrode RE1 and the first contact electrode CE1 may overlap. The second reflective electrode RE2 and the second contact electrode CE2 may overlap.

The first reflective electrode RE1 may be electrically connected to a predetermined circuit element through a contact hole CNT. For example, the circuit element may be at least one transistor that constitutes a pixel.

Figure 3:
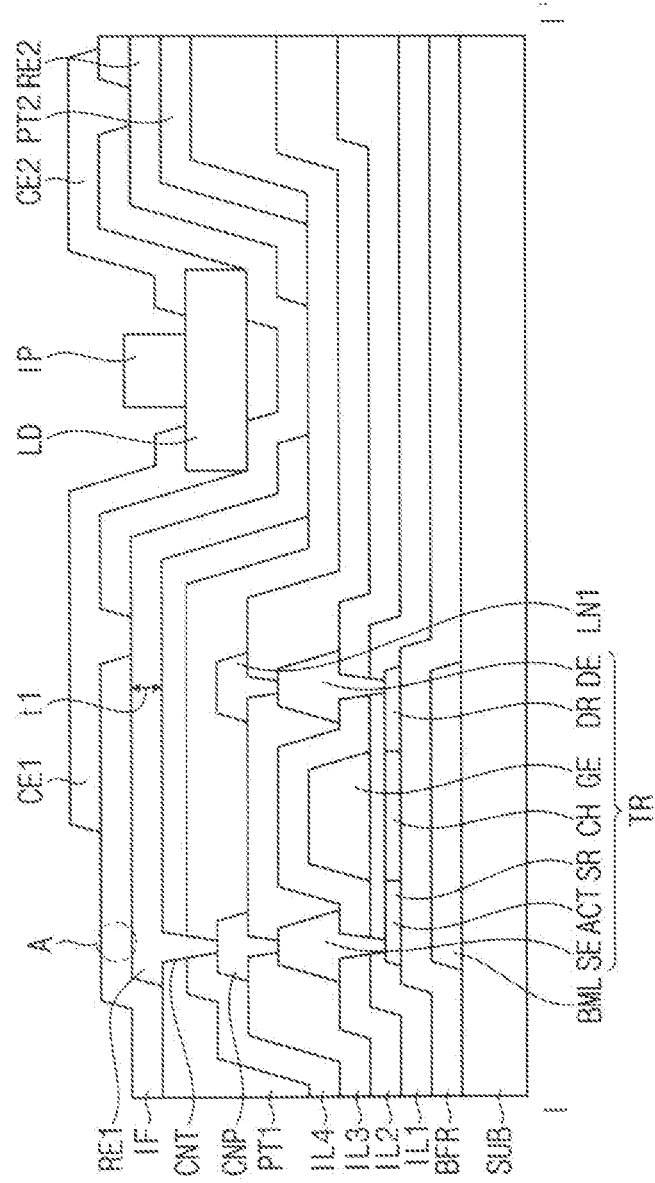
FIG. 3 is a cross-sectional view illustrating an embodiment of a display device taken along line I-I' of FIG. 2.
Figure 4:
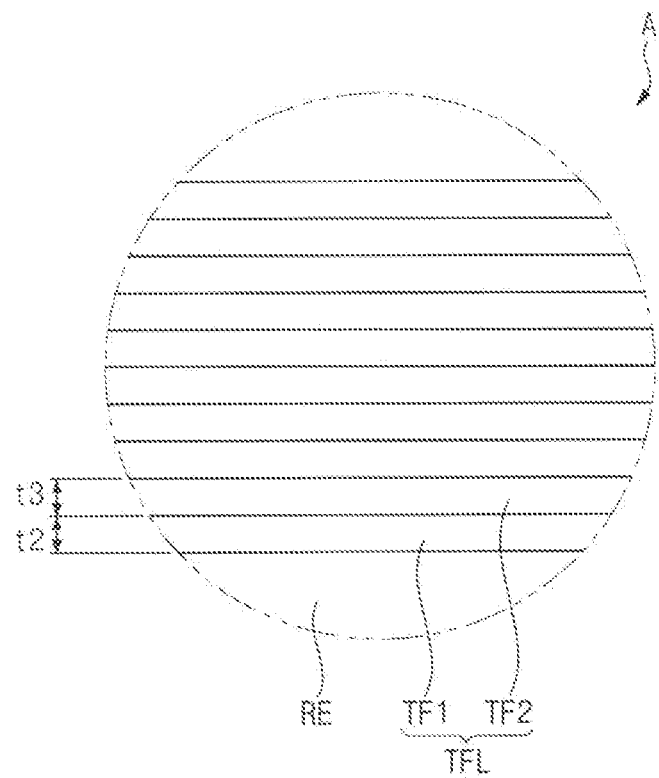
FIG. 4 is an enlarged view of area A of FIG. 3.

FIG. 3 is a cross-sectional view illustrating an embodiment of a display device taken along line I-I' of FIG. 2. FIG. 4 is an enlarged view of area A of FIG. 3.

Referring to FIGS. 1 to 4, the display device 10 may include a substrate SUB. The substrate SUB may be consist of various materials. For example, the substrate SUB may be consist of a transparent glass material containing SiO2 as a main component. However, the substrate SUB is not necessarily limited thereto, and may be consist of a transparent plastic material.

A light blocking layer BML may be disposed on the substrate SUB. The light blocking layer BML may overlap the active pattern ACT. The light blocking layer BML may block light from the substrate SUB to reach the channel region CH of the active pattern ACT. The light blocking layer BML may include a metal. Examples of the metal forming the light blocking layer BML may include molybdenum (Mo), aluminum (Al), chromium (Cr), gold (Au), titanium (Ti), nickel (Ni), neodymium (Nd), copper (Cu), etc. The above materials may be used alone or in combination.

The buffer layer BFR may cover the light blocking layer BML and may be disposed on the substrate SUB. The buffer layer BFR may block impurities from the substrate SUB into the active pattern ACT during a heat treatment of the active pattern ACT. Examples of the material constituting the buffer layer BFR may include silicon oxide, silicon nitride, silicon oxynitride, etc. The above materials may be used alone or in combination.

In the display area DA, the active pattern ACT may be disposed on the buffer layer BFR. Examples of the material forming the active pattern ACT may include a silicon semiconductor amorphous silicon, polycrystalline silicon, etc. The above materials may be used alone or in combination.

The active pattern ACT may include a channel region CH, a source region SR contacting the channel region CH, and a drain region DR contacting the channel region CH. The source region SR and the drain region DR may be electrically connected to the source electrode SE and the drain electrode DE, respectively.

In the display area DA, a first insulation layer IL1 may cover the active pattern ACT and may be disposed on the buffer layer BFR. The first insulation layer IL1 may include an insulating material. Examples of the insulating material forming the first insulation layer IL1 may include silicon oxide, silicon nitride, silicon oxynitride, aluminum oxide, etc. The above materials may be used alone or in combination. The first insulation layer IL1 may have a single layer or multi-layer structure.

In the display area DA, a gate electrode GE may be disposed on the first insulation layer IL1. The gate electrode GE may include a metal. The gate electrode GE may overlap the channel region CH of the active pattern ACT. Examples of the metal forming the gate electrode GE may include molybdenum (Mo), aluminum (Al), copper (Cu), titanium (Ti), etc. The above materials may be used alone or in combination.

In the display area DA, the second insulation layer IL2 may cover the gate electrode GE and may be disposed on the first insulation layer ILL The second insulation layer IL2 may include an insulating material. Examples of the insulating material forming the second insulation layer IL2 may include silicon oxide, silicon nitride, silicon oxynitride, etc. The above materials may be used alone or in combination. The second insulation layer IL2 may have a single layer or multi-layer structure.

In the display area DA, a source electrode SE and a drain electrode DE may be disposed on the second insulation layer IL2. Each of the source electrode SE and the drain electrode DE may include a metal. Examples of the metal forming the source electrode SE and the drain electrode DE may include molybdenum (Mo), aluminum (Al), copper (Cu), titanium (Ti), etc. The above materials may be used alone or in combination.

The source electrode SE and the drain electrode DE may be electrically connected to the active pattern ACT. The source electrode SE may electrically contact the active pattern ACT through contact holes formed in the first insulation layer IL1 and the second insulation layer IL2. For example, the source electrode SE may electrically contact the source region SR of the active pattern ACT. The drain electrode DE may electrically contact the active pattern ACT through contact holes formed in the first insulation layer IL1 and the second insulation layer IL2. For example, the drain electrode DE may contact the drain region DR of the active pattern ACT.

The active pattern ACT, the gate electrode GE, the source electrode SE, and the drain electrode DE may constitute a transistor TR. The transistor TR may control a driving current of the light emitting diode LD.

In the display area DA, a third insulation layer IL3 may cover the source electrode SE and the drain electrode DE, and may be disposed on the second insulation layer IL2. The third insulation layer IL3 may include an insulating material. The insulating material forming the third insulation layer IL3 may include silicon oxide, silicon nitride, silicon oxynitride, etc. The above materials may be used alone or in combination.

In the display area DA, a first line LN1 and a connection pattern CNP may be disposed on the third insulation layer IL3. For example, the first line LN1 may be a data line DL. Each of the first line LN1 and the connection pattern CNP may include a metal. Examples of the metal forming the first line LN1 and the connection pattern CNP may include molybdenum (Mo), aluminum (Al), copper (Cu), titanium (Ti), etc. The above materials may be used alone or in combination.

The connection pattern CNP may electrically contact the source electrode SE through a contact hole formed in the third insulation layer IL3. The first line LN1 may electrically contact the drain electrode DE through a contact hole formed in the third insulation layer IL3. However, the disclosure is not limited thereto, and in other embodiment, the connection pattern CNP may electrically contact the drain electrode DE, and the first line LN1 may electrically contact the source electrode SE.

In the display area DA, a fourth insulation layer IL4 may cover the first line LN1 and the connection pattern CNP, and may be disposed on the third insulation layer IL3. The fourth insulation layer IL4 may include an insulating material. Examples of the insulating material forming the fourth insulation layer IL4 may include silicon oxide, silicon nitride, silicon oxynitride, etc. The above materials may be used alone or in combination.

In the display area DA, a partition PT may be disposed on the fourth insulation layer IL4. The partition PT may include an inorganic insulating material or an organic insulating material. Examples of the inorganic insulating material forming the partition PT may include silicon oxide, silicon nitride, silicon oxynitride, etc. The above materials may be used alone or in combination.

The partition PT may include a first partition PT1 and a second partition PT2. The first partition PT1 and the second partition PT2 may be disposed on a same layer or may be spaced apart from each other. The first partition PT1 may overlap the connection pattern CNP and the first line LN1.

In the display area DA, the reflective electrode RE may be disposed on the partition PT. The reflective electrode RE may electrically contact the connection pattern CNP through the contact hole CNT formed in the partition PT and the fourth insulation layer IL4.

The reflective electrode RE may include molybdenum (Mo). Since the reflective electrode RE may include molybdenum, contact resistance between the reflective electrode RE and the contact electrode CE may be improved. In addition, chemical resistance of the reflective electrode RE may be improved.

The reflective electrode RE may include a first reflective electrode RE1 and a second reflective electrode RE2. The first reflective electrode RE1 and the second reflective electrode RE2 may be disposed on a same layer or may be spaced apart from each other. The first reflective electrode RE1 may partially overlap the first partition wall PT1. One end of the first reflective electrode RE1 that does not overlap the first partition PT1 may electrically contact the fourth insulation layer IL4. The second reflective electrode RE2 may partially overlap the second partition PT2. One end of the second reflective electrode RE2 that does not overlap the second partition PT2 may electrically contact the fourth insulation layer IL4.

A thickness t1 of the reflective electrode RE may be about 500 Å or more and about 4000 Å or less. In case the thickness t1 of the reflective electrode RE is about 500 Å or less, a transmittance of the reflective electrode RE may be increased, and thus a reflectance of the reflective electrode RE may decrease. In case the thickness t1 of the reflective electrode RE is about 4000 Å or more, a thickness difference between a central portion and an edge portion of the display device 10 may exist. As a result, stress is applied to the substrate SUB of the display device 10, and the substrate SUB may be bent or broken.

In an embodiment, an insulating film IF may cover the reflective electrode RE and may be disposed on the reflective electrode RE, the partition PT, and the fourth insulation layer IL4. The insulating film IF may include at least one thin film layer TFL (shown in FIG. 4). For example, the insulating film IF may include five or more thin film layers TFL.

In an embodiment, the thin film layer TFL may include a first thin film TF1 and a second thin film TF2. The first thin film TF1 may be disposed on the reflective electrode RE. The second thin film TF2 may be disposed on the first thin film TF1.

In an embodiment, the first thin film TF1 may have a first refractive index, and the second thin film TF2 may have a second refractive index. The first refractive index may be greater than the second refractive index. For example, the first refractive index may be about 2.0 or more, and may have a relatively high refractive index. The second refractive index may be about 1.8 or less, and may have a relatively low refractive index. Accordingly, the first thin film TF1 may be referred to as a high refractive index thin film. The second thin film TF2 may be referred to as a low refractive index thin film.

When the first refractive index is about 2.0 or less and the second refractive index is about 1.8 or more, a difference between the first refractive index and the second refractive index may be small. Accordingly, the first thin film TF1 and the second thin film TF2 may be difficult to function as a stacked structure of the low refractive index thin film and the high refractive index thin film.

In an embodiment, the first thin film TF1 may include at least one of niobium pentoxide ($Nb_2O_5$), titanium dioxide ($TiO_2$), and zirconium dioxide ($ZrO_2$). Niobium pentoxide ($Nb_2O_5$), titanium dioxide ($TiO_2$), and zirconium dioxide ($ZrO_2$) may be materials having a refractive index of about 2.0 or more. For example, when the first thin film TF1 includes niobium pentoxide ($Nb_2O_5$), the first refractive index of the first thin film TF1 with respect to light having a wavelength of about 450 nm may be about 2.36. Also, when the first thin film TF1 includes titanium dioxide ($TiO_2$), the first refractive index of the first thin film TF1 with respect to light having a wavelength of about 450 nm may be about 2.24. However, embodiments according to the disclosure are not limited thereto, and in other embodiments, the first thin film TF1 may include other material having a refractive index of about 2.0 or more.

In an embodiment, the second thin film TF2 may include at least one of aluminum oxide ($Al_2O_3$) and magnesium fluoride ($MgF_2$). Aluminum oxide ($Al_2O_3$) and magnesium fluoride ($MgF_2$) may be materials having a refractive index of about 1.8 or less. For example, when the second thin film TF2 includes Aluminum oxide ($Al_2O_3$), the second refractive index of the second thin film TF2 with respect to light having a wavelength of 450 nm may be about 1.62. However, embodiments according to the disclosure are not limited thereto, and in other embodiment, the second thin film TF2 may include other material having a refractive index of about 1.8 or less.

In an embodiment, the insulating film IF may include five or more thin film layers TFL. In FIG. 4, the thin film layers TFL are stacked with five layers, but in other embodiment, the display device 10 may include a structure in which the thin film layers TFL are stacked with five or more layers. The insulating film IF may include a structure in which the first thin film TF1 and the second thin film TF2 are alternately stacked. The insulating film IF may have a structure in which five or more thin film layers TFL are stacked, or a structure in which the high refractive index thin film and the low refractive index thin film are alternately stacked.

In an embodiment, since the insulating film IF includes the thin film layers TFL stacked in five or more layers, the reflectance of the reflective electrode RE may be improved. For example, when the insulating film IF includes five or more of the thin film layers TFL with the first thin film TF1 and the second thin film TF2, the reflectance of the reflective electrode RE may be improved by about 90% or more.

A contact electrode CE may be disposed on the insulating film IF. The contact electrode CE may include a transparent conductive material. Examples of the transparent conductive material forming the contact electrode CE may include indium tin oxide (ITO), indium zinc oxide (IZO), and indium tin zinc oxide (ITZO). The above materials may be used alone or in combination. Accordingly, light emitted from the light emitting diodes may pass through the contact electrode CE and may be emitted to the outside of the display device 10.

The contact electrode CE may electrically contact the reflective electrode RE through a contact hole formed in the insulating film IF. Accordingly, the contact electrode CE may be electrically connected to the reflective electrode RE.

The contact electrode CE may include a first contact electrode CE1 and a second contact electrode CE2. The first contact electrode CE1 and the second contact electrode CE2 may be disposed on a same layer or may be spaced apart from each other. At least one light emitting diode LD may be disposed between the first contact electrode CE1 and the second contact electrode CE2. The first contact electrode CE1 and the second contact electrode CE2 may face each other with respect to the light emitting diode LD.

The light emitting diode LD may be disposed between the first contact electrode CE1 and the second contact electrode CE2. The first contact electrode CE1 and the second contact electrode CE2 may cover each end of the light emitting diode LD, respectively. Accordingly, the light emitting diode LD may be electrically connected to the first contact electrode CE1 and the second contact electrode CE2.

An insulating pattern IP may be disposed on the light emitting diode LD. A width of the insulating pattern IP may be narrower than the width of the light emitting diode LD. Accordingly, the insulating pattern IP may expose both ends of the light emitting diode LD. Accordingly, the insulating pattern IP may stably separate the first contact electrode CE1 and the second contact electrode CE2.

In an embodiment, the reflective electrode RE may include molybdenum, and the insulating film IF may have a structure in which the thin film layers TFL including the first thin film TF1 and the second thin film TF2 are alternately stacked with five or more layers. Accordingly, contact resistance between the reflective electrode RE and the contact electrode CE may be improved, and corrosion between the reflective electrode RE and the contact electrode CE may be reduced. Thus, chemical resistance of the reflective electrode RE may be improved. In addition, due to the stacked structure of the high refractive index thin film and the low refractive index thin film of the insulating film IF, the reflectance of the reflective electrode RE may be improved by about 90% or more. Accordingly, the light efficiency of the display device 10 may be improved, and the display quality of the display device 10 may be improved.

Figure 5:
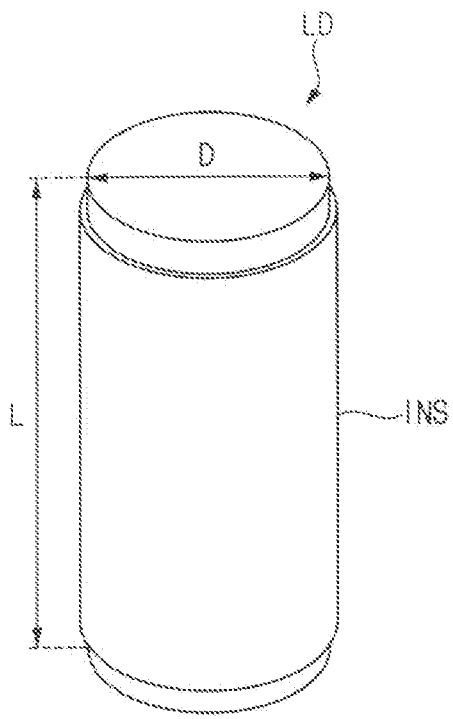
FIG. 5 is a perspective view illustrating an embodiment of a light emitting diode included in a display device.
Figure 6:
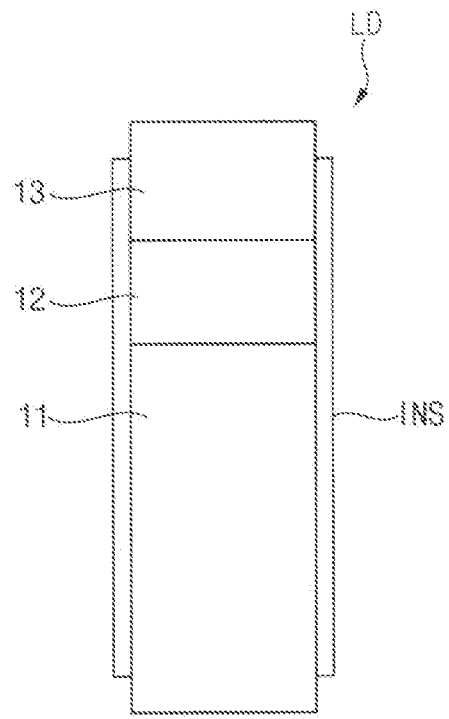
FIG. 6 is a cross-sectional view illustrating an embodiment of a light emitting diode included in a display device.

FIG. 5 is a perspective view illustrating an embodiment of a light emitting diode included in a display device. FIG. 6 is a cross-sectional view illustrating an embodiment of a light emitting diode included in a display device. FIGS. 5 and 6 illustrates a rod-shaped light emitting diode LD having a cylindrical shape, a type and/or shape of the light emitting diode LD of the disclosure is not limited thereto.

Referring to FIGS. 5 and 6, the light emitting diode LD according to an embodiment of the disclosure may include a first conductive type semiconductor layer 11, a second conductive type semiconductor layer 13, and an active layer 12 disposed between the first and second conductive type semiconductor layers 11 and 13. For example, the light emitting diode LD may have a structure in which the first conductive type semiconductor layer 11, the active layer 12, and the second conductive type semiconductor layer 13 are sequentially stacked along a length (L) direction.

The light emitting diode LD may have a rod shape extending in one direction. If the extending direction of the light emitting diode LD is referred to as the length (L) direction, the light emitting diode LD may have one end and another end along the length (L) direction.

One of the first and second conductive type semiconductor layers 11 and 13 may be disposed at one end of the light emitting diode LD. In addition, the other one of the first and second conductive type semiconductor layers 11 and 13 may be disposed at another end of the light emitting diode LD.

The light emitting diode LD may be a rod shaped light emitting diode. For example, a length L of the light emitting diode LD may be greater than a diameter D (or a width of a cross-section) thereof.

The light emitting diode LD may have a size as small as a nano-scale or a micro-scale. As an example, each of the light emitting diodes LD may have a diameter D and/or the length L in a nano-scale or micro-scale range. However, a size of the light emitting diode LD according to the disclosure is not limited thereto. For example, the size of the light emitting diode LD may have various sizes according to design needs of a light emitting device 10 using a light emitting diode LD.

For example, the first conductive type semiconductor layer 11 may include at least one n-type semiconductor layer. For example, the first conductive type semiconductor layer 11 may include a semiconductor material. Examples of the semiconductor material forming the first conductive type semiconductor layer 11 may include InAlGaN, GaN, AlGaN, InGaN, AlN, InN, etc. The above materials may be used alone or in combination. Also, the first conductive type semiconductor layer 11 may include an n-type semiconductor layer doped with a first conductive type dopant such as Si, Ge, Sn, etc. However, the material forming the first conductive type semiconductor layer 11 is not limited thereto.

The active layer 12 may be disposed on the first conductive type semiconductor layer 11 and may be formed in a single or multiple quantum well structure. The active layer 12 may include AlGaN, AlInGaN, or the like. A clad layer doped with a conductive dopant may be disposed on upper and/or lower portions of the active layer 12. For example, the clad layer may include AlGaN or InAlGaN.

In case a voltage equal to or greater than a threshold voltage is applied to both ends of the light emitting diode LD, electron-hole pairs may be created in the active layer 12. Accordingly, the light emitting diode LD may emit light, and the light emitting diode LD may be used as a light source of various light emitting devices 10.

The second conductive type semiconductor layer 13 may be disposed on the active layer 12, and may include a semiconductor layer of a different type from that of the first conductive type semiconductor layer 11. For example, the second conductive type semiconductor layer 13 may include at least one p-type semiconductor layer. For example, the second conductive type semiconductor layer 13 may include a semiconductor material. Examples of the material forming the second conductive type semiconductor layer 13 may include InAlGaN, GaN, AlGaN, InGaN, AlN, InN, etc. Also, the second conductive type semiconductor layer 13 may include a p-type semiconductor layer doped with a second conductive type dopant such as Mg. However, the material forming the second conductive type semiconductor layer 13 is not limited thereto.

The light emitting diode LD may further include an insulating thin film INS provided on a surface thereof. The insulating thin film INS may surround at least an outer peripheral surface of the active layer 12. In addition, the insulating thin film INS may further surround some portion of the outer peripheral surface of the first and second conductive type semiconductor layers 11 and 13. However, the insulating thin film INS may expose both ends of the light emitting diode LD having different polarities. For example, the insulating thin film INS may expose a portion of each of the first conductive type semiconductor layer 11 and the second conductive type semiconductor layer 13.

The insulating thin film INS may include an insulating material. Examples of the insulating material forming the insulating thin film INS may include silicon dioxide ($SiO_2$), silicon nitride ($Si_3N_4$), aluminum oxide ($Al_2O_3$), or titanium dioxide ($TiO_2$). The above materials may be used alone or in combination. However, the material forming the insulating thin film INS is not limited thereto.

Embodiments according to the disclosure are not limited to the configuration of the light emitting diode LD described with reference to FIGS. 5 and 6, and the light emitting diode LD according to the disclosure may further include additional components in addition to the first conductive type semiconductor layer 11, the active layer 12, and the second conductive type semiconductor layer 13 and/or the insulating thin film INS. For example, the light emitting diode LD may further include one or more phosphor layers, active layers, semiconductors layer and/or electrode layers.

Figure 7:
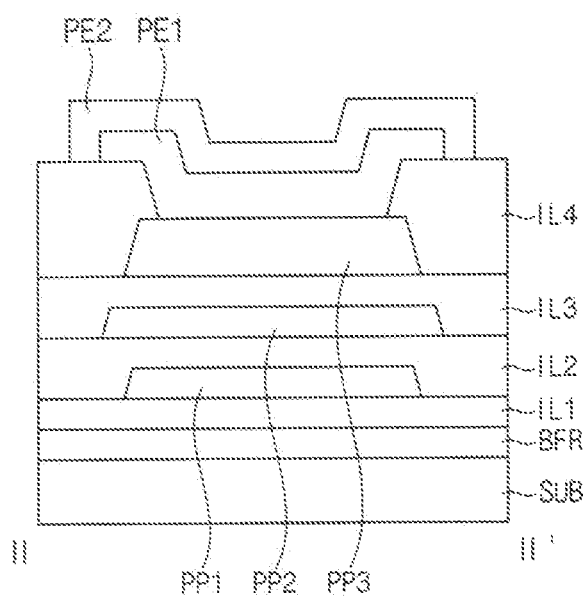
FIG. 7 is a cross-sectional view illustrating an embodiment of a display device taken along line II-IF of FIG. 1.

FIG. 7 is a cross-sectional view illustrating an example of a display device taken along line II-IF of FIG. 1.

Referring to FIGS. 1, 3, and 7, in the pad area PA, a buffer layer BFR may be disposed on the substrate SUB. The substrate SUB and the buffer layer BFR may be disposed in the pad area PA and the display area DA. A first insulation layer IL1 may be disposed on the buffer layer BFR. The first insulation layer IL1 may be disposed in the pad area PA and the display area DA.

In the pad area PA, a first pad pattern PP1 may be disposed on the first insulation layer ILL. The first pad pattern PP1 may be a single layer or a multi-layer. The first pad pattern PP1 may be disposed on the same layer as the gate electrode GE of the display area DA. The first pad pattern PP1 and the gate electrode GE may include a same material. For example, the first pad pattern PP1 may include a material identical to that of the gate electrode GE.

The second insulation layer IL2 may cover the first pad pattern PP1 and may be disposed on the first insulation layer ILL. The second insulation layer IL2 may be disposed in the pad area PA and the display area DA.

In the pad area PA, a second pad pattern PP2 may be disposed on the second insulation layer IL2. The second pad pattern PP2 may be disposed on the same layer as the source electrode SE and the drain electrode DE of the display area DA. The second pad pattern PP2, the source electrode SE, and the drain electrode DE may include a same material. For example, the second pad patter PP2 may include a material identical to that of the source electrode SE and/or the drain electrode DE.

In the pad area PA, the third insulation layer IL3 may cover the second pad pattern PP2 and may be disposed on the second insulation layer IL2. The third insulation layer IL3 may be disposed in the pad area PA and the display area DA.

A third pad pattern PP3 may be disposed on the third insulation layer IL3 in the pad area PA. The third pad pattern PP3 may be disposed on the same layer as the connection pattern CNP and the first line LN1 of the display area DA. The third pad pattern PP3 and the connection pattern CNP and the first line LN1 may include a same material. For example, the third pad pattern PP3 may include a material identical to those of the connection pattern CNP and/or the first line LN1.

In the pad area PA, the fourth insulation layer IL4 may cover the third pad pattern PP3 and may be disposed on the third insulation layer IL3. The fourth insulation layer IL4 may be disposed in the pad area PA and the display area DA.

A first pad electrode PE1 may be disposed on the fourth insulation layer IL4 in the pad area PA. The first pad electrode PE1 may be electrically connected to the third pad pattern PP3 through a contact hole formed in the fourth insulation layer IL4.

The first pad electrode PE1 may be disposed on the same layer as the reflective electrode RE of the display area DA. The first pad electrode PE1 and the reflective electrode RE may include a same material. For example, the first pad electrode PE1 may include a material identical to that of the reflective electrode RE. The first pad electrode PE1 may include molybdenum. Accordingly, chemical resistance of the first pad electrode PE1 may be improved.

In the pad area PA, a second pad electrode PE2 may cover the first pad electrode PE1 and may be disposed on the fourth insulation layer IL4 and the first pad electrode PE1. In the pad area PA, the first pad electrode PE1 and the second pad electrode PE2 may contact each other and may be electrically connected to each other.

The second pad electrode PE2 may be disposed on the same layer as the contact electrode CE of the display area DA. The second pad electrode PE2 and the contact electrode CE may include a same material. For example, the second pad electrode PE2 may include a material identical to that of the contact electrode CE. The second pad electrode PE2 may include a transparent conductive material. Examples of the transparent conductive material forming the second pad electrode PE2 may include indium tin oxide (ITO), indium zinc oxide (IZO), and indium tin zinc oxide (ITZO). The above materials may be used alone or in combination.

Since the first pad electrode PE1 includes molybdenum in the pad area PA, chemical resistance of the first pad electrode PE1 may be improved.

Figure 8:
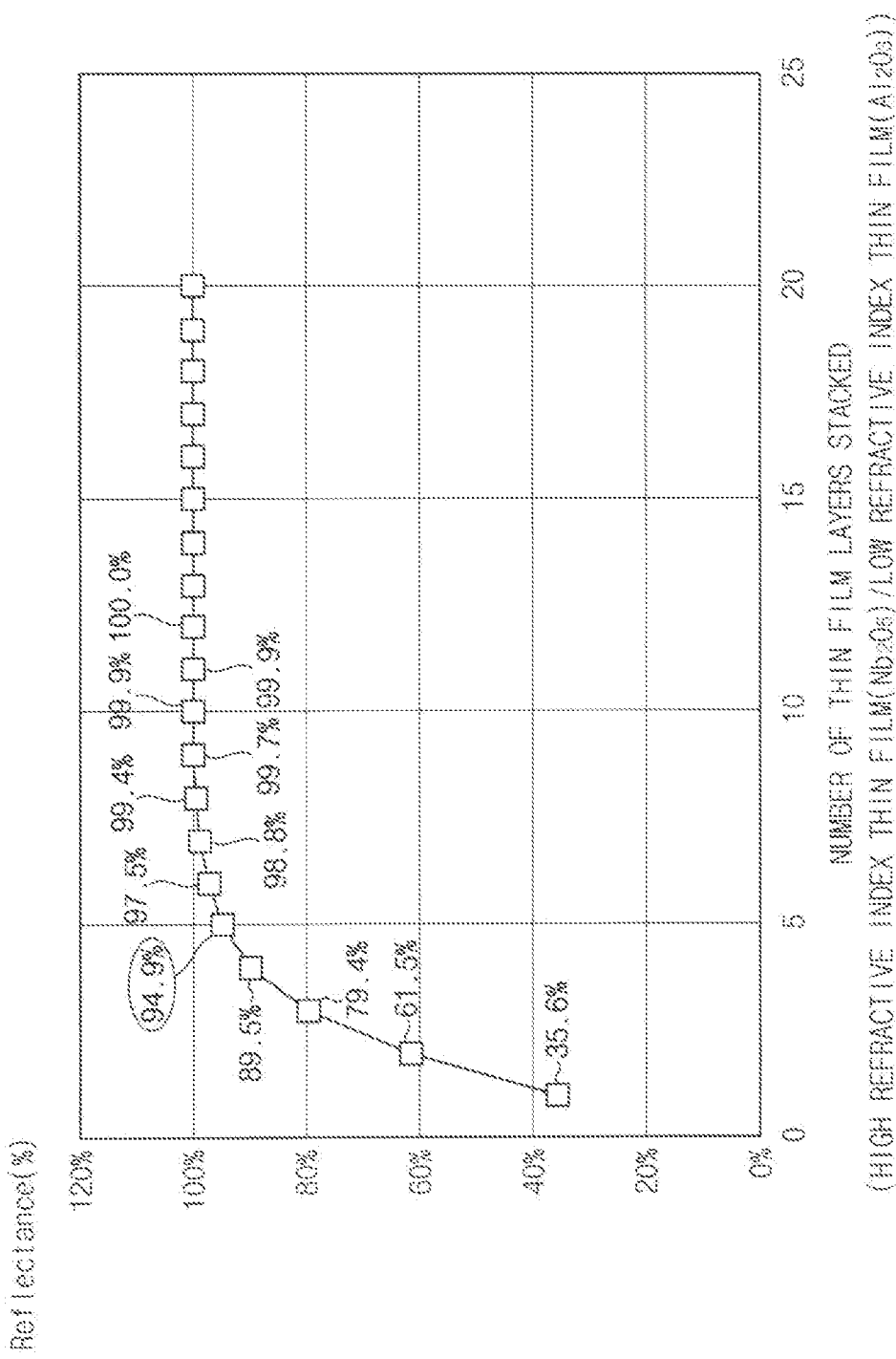
FIGS. 8 and 9 are simulation graphs illustrating reflectance of a structure in which a reflective electrode and several thin film layers are stacked each other based on the number of thin film layers stacked.
Figure 9:
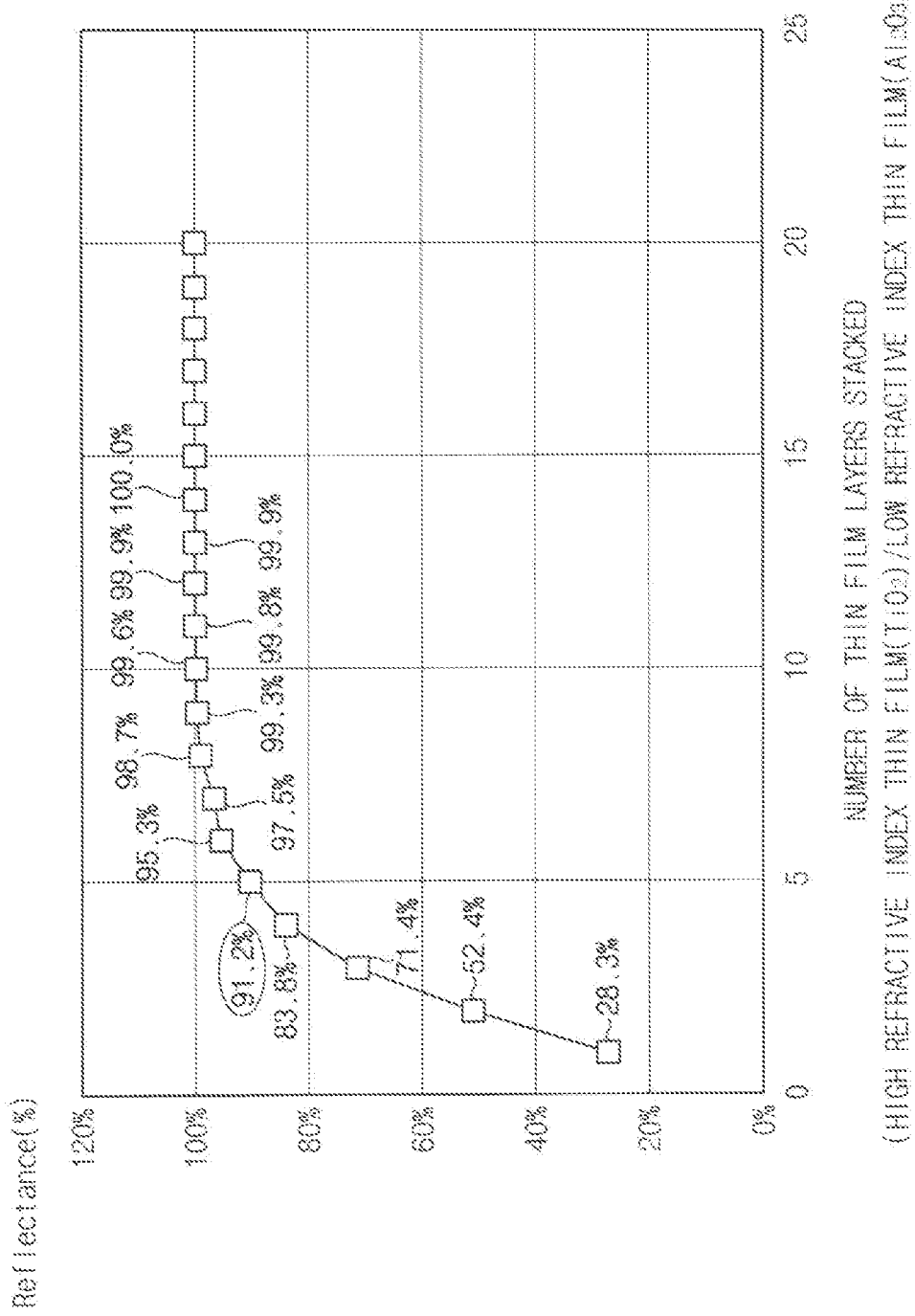

FIGS. 8 and 9 are simulation graphs illustrating reflectance of a structure in which a reflective electrode and several thin film layers are stacked each other based on the number of thin film layers stacked. A thin film layer of FIG. 8 has a structure in which a high refractive index thin film containing $Nb_2O_5$ and a low refractive index thin film containing $Al_2O_3$ are stacked, and a thin film layer of FIG. 9 has a structure in which a high refractive index thin film containing $TiO_2$ and a low refractive index thin film containing $Al_2O_3$ are stacked each other. For example, the high refractive index thin film may be the first thin film TF1 of FIG. 4, and the low refractive index thin film may be the second thin film TF2 of FIG. 4. In addition, the thin film layer may be the thin film layer TFL of FIG. 4, and the reflective electrode may be the reflective electrode RE of FIG. 3.

Referring to FIGS. 8 and 9, a vertical axis of each graph indicates reflectance (%), and the horizontal axis indicates the number of thin film layers stacked in which a high refractive index thin film and a low refractive index thin film are stacked each other. The reflectance is a reflectance for light having a wavelength of about 450 nm.

FIGS. 8 and 9 are simulation graphs according to following equations, respectively, and a relationship between the refractive index of each layer, the number of thin film layers stacked, and the reflectance may be shown by the following equations.

$$Y = \left(\frac{n_H}{n_L}\right)^{2S} \left(\frac{n_H^2}{n_{sub}}\right)$$

-continued
$$R = \left[\frac{1-Y}{1+Y}\right]^2$$

In this formula, $n_H$ is the refractive index of the high refractive index thin film, $n_L$ is the refractive index of the low refractive index thin film, and $n_{sub}$ is the refractive index of the reflective electrode. s is the number of thin film layers stacked, and R is the reflectance of a structure in which a reflective electrode and one or more thin film layers are stacked.

As shown in FIGS. 8 and 9, as the number of the thin film layers stacked increases, the reflectance of the stacked structure of the reflective electrode and the thin film layer increases. When the number of thin film layers stacked is 5 or more, the reflectance of the structure in which the reflective electrode and multiple thin film layers are stacked is about 90% or more. According to the graphs, when the high refractive index thin film includes $Nb_2O_5$, the reflectance is higher than when the high refractive index thin film includes $TiO_2$.

Figure 10:
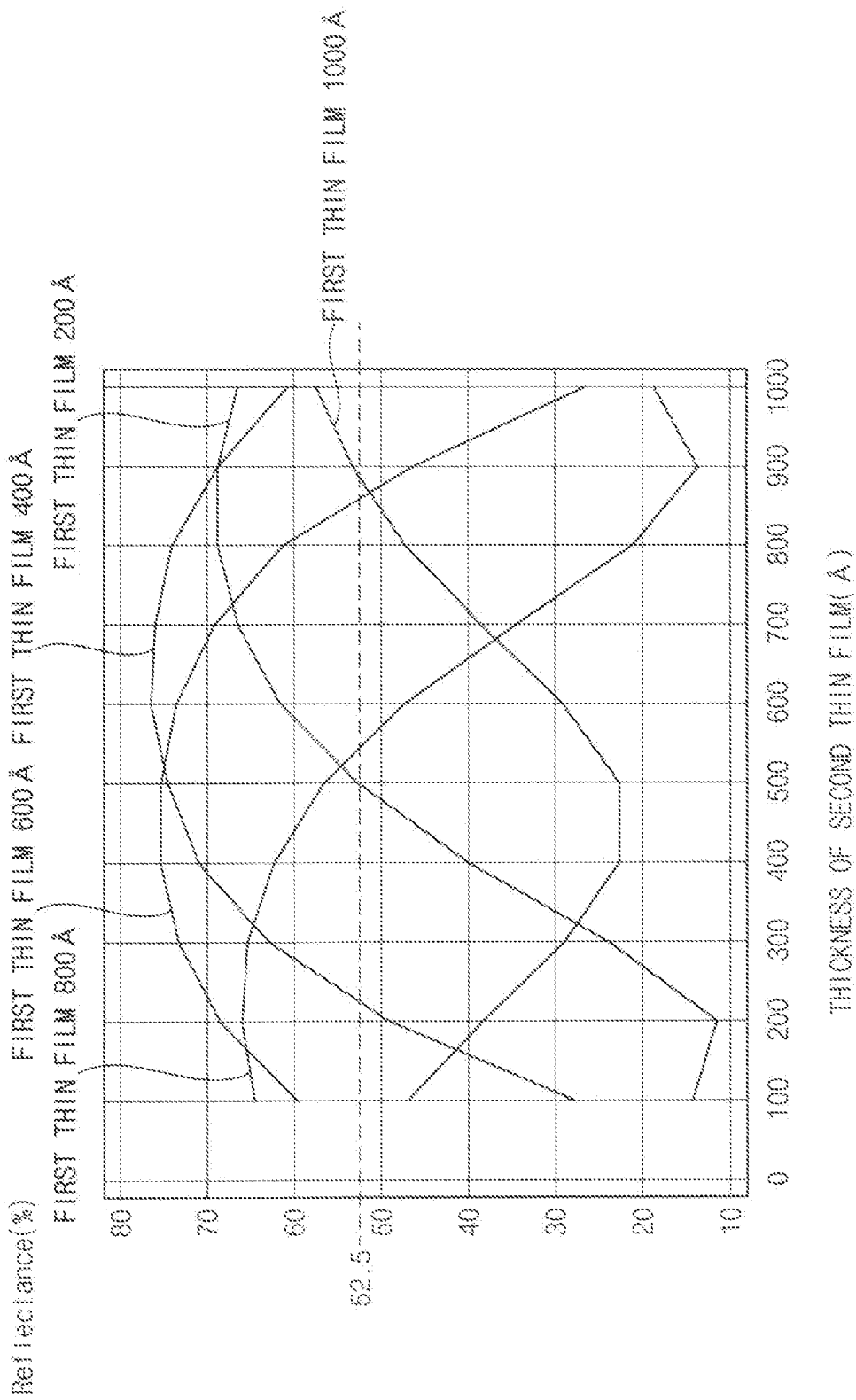
FIG. 10 is a simulation graph illustrating reflectance based on a thickness of the second thin film when a first thin film has a specific thickness.

FIG. 10 is a simulation graph illustrating reflectance based on a thickness of the second thin film when a first thin film has a specific thickness. Specifically, FIG. 10 is a graph illustrating the reflectance based on the thickness of the second thin film TF2 when the first thin film TF1 is about 200 Å, about 400 Å, about 600 Å, about 800 Å, and about 1000 Å, respectively.

A vertical axis of the graph indicates the reflectance (%) of the structure in which the reflective electrode and one thin film layer are stacked, and a horizontal axis indicates the thickness (Å) of the second thin film TF2. The reflectance is the reflectance for light having a wavelength of about 450 nm.

Referring to FIGS. 4 and 10, when the reflectance of the thin film layer TFL with the first thin film TF1 and the second thin film TF2 stacked each other is about 52.5% or more, a reflectance of the insulating film IF with five or more thin film layer TFL may be about 90% or more.

Therefore, as shown in FIG. 10, when the thickness of the second thin film TF2 is about 520 Å or more and about 1000 Å or less, and the thickness of the first thin film TF1 is about 200 Å or more and about 400 Å or less, the reflectance of the structure in which the reflective electrode and one thin film layer are stacked may be about 52.5% or more. In addition, even when the thickness of the first thin film TF1 is about 600 Å, when the thickness of the second thin film TF2 is about 860 Å or less, the reflectance may be about 52.5% or more.

When the thickness of the second thin film TF2 is about 520 Å or less, and about 100 Å or more, and the first thin film TF1 is about 600 Å or more and about 800 Å or less, the reflectance may be about 52.5% or more. Even when the thickness of the first thin film TF1 is about 400 Å and the thickness of the second thin film TF2 is about 220 Å or more, the reflectance may be about 52.5% or more.

Hereinafter, a method of manufacturing a display device according to an embodiment will be described with reference to FIGS. 11 to 16.

FIGS. 11 to 16 are cross-sectional views illustrating a method of manufacturing a display device according to an embodiment. For example, FIGS. 11 to 16 may illustrate a manufacturing method of the display device 10 described with reference to FIGS. 1 to 7.

Figure 11:
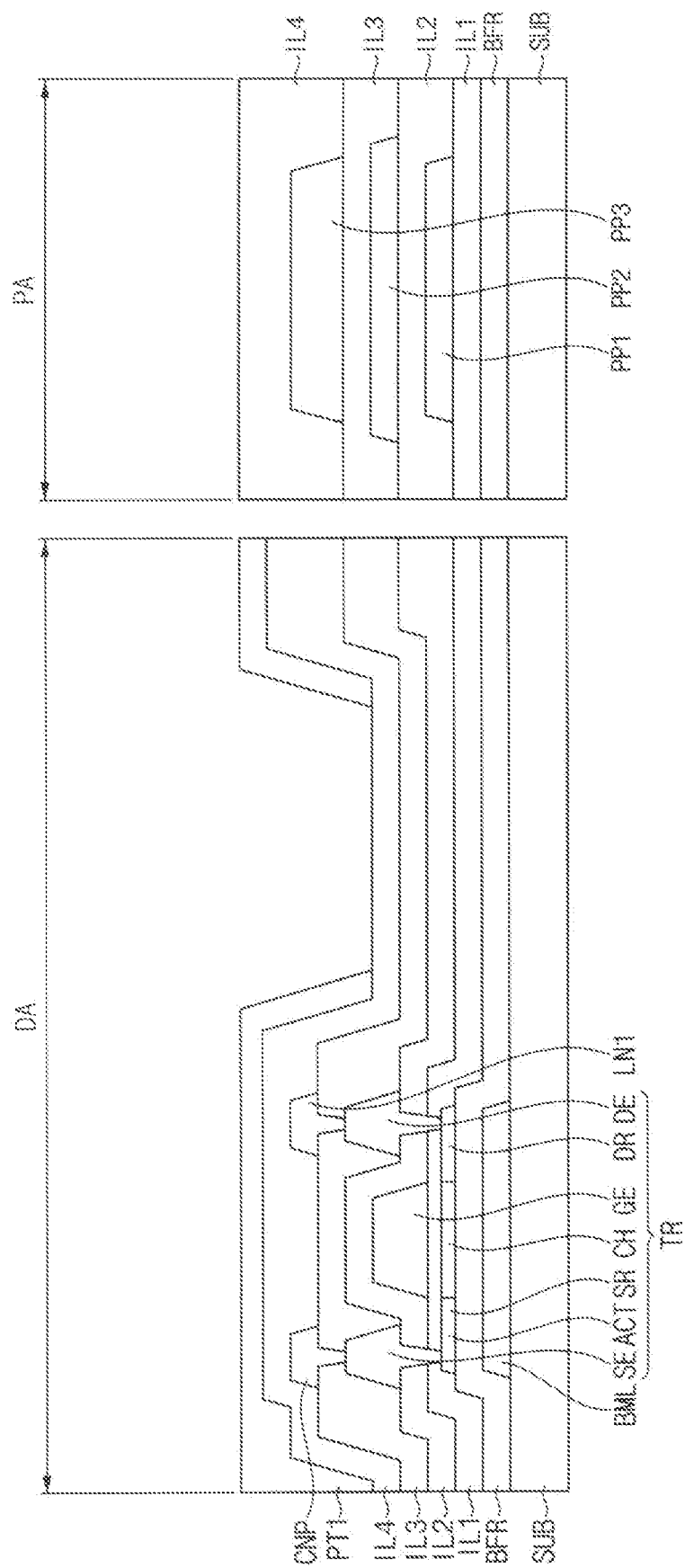
FIGS. 11 to 16 are cross-sectional views illustrating a method of manufacturing a display device according to an embodiment.

Referring to FIG. 11, a light blocking layer BML, a buffer layer BFR, an active pattern ACT, a first insulation layer ILL, a gate electrode GE, and a first pad pattern PP1, a second insulation layer IL2, a source electrode SE, a drain electrode DE, a second pad pattern PP2, a third insulation layer IL3, a fourth insulation layer IL4, and a partition PT may be sequentially formed.

First, the light blocking layer BML may be formed on the substrate SUB. The light blocking layer BML may be formed in the display area DA. A buffer layer BFR may be formed on the substrate SUB to cover the light blocking layer BML. The buffer layer BFR may be formed in the display area DA and the pad area PA.

Next, the active pattern ACT may be formed on the buffer layer BFR. The first insulation layer IL1 may be formed on the buffer layer BFR to cover the active pattern ACT. The active pattern ACT may be formed in the display area DA.

Next, the gate electrode GE and the first pad pattern PP1 may be formed on the first insulation layer IL1. A second insulation layer IL2 may be formed on the first insulation layer IL1 to cover the gate electrode GE and the first pad pattern PP1. The gate electrode GE may be formed in the display area DA. The first pad pattern PP1 may be formed in the pad area PA. The gate electrode GE and the first pad pattern PP1 may include a same material and may be formed substantially simultaneously.

Next, the source electrode SE, the drain electrode DE, and the second pad pattern PP2 may be formed on the second insulation layer IL2. The source electrode SE and the drain electrode DE may be respectively formed in contact holes formed in the first insulation layer IL1 and the second insulation layer IL2. Accordingly, the source electrode SE and the drain electrode DE may electrically contact the active pattern ACT through the contact holes.

The third insulation layer IL3 may be formed on the second insulation layer IL2 to cover the source electrode SE, the drain electrode DE, and the second pad pattern PP2. The source electrode SE and the drain electrode DE may be formed in the display area DA. The second pad pattern PP2 may be formed in the pad area PA. The source electrode SE, the drain electrode DE, and the second pad pattern PP2 may include a same material and may be formed substantially simultaneously.

By forming the active pattern ACT, the gate electrode GE, the source electrode SE, and the drain electrode DE, the transistor TR may be formed.

Next, a connection pattern CNP, a first line LN1, and a third pad pattern PP3 may be formed on the third insulation layer IL3. A connection pattern CNP and a first line LN1 may be respectively formed in contact holes formed in the third insulation layer IL3. Accordingly, the connection pattern CNP may electrically contact the source electrode SE, and the first line LN1 may electrically contact the drain electrode DE through the contact holes.

The fourth insulation layer IL4 may be formed on the third insulation layer IL3 to cover the connection pattern CNP, the first line LN1, and the third pad pattern PP3. The connection pattern CNP and the first line LN1 may be formed in the display area DA. The third pad pattern PP3 may be formed in the pad area PA. The connection pattern CNP, the first line LN1, and the third pad pattern PP3 may include a same material and may be formed substantially simultaneously.

Next, the partition PT may be formed on the fourth insulation layer IL4. The partition PT may be formed in the display area DA. The partition PT may include a first partition PT1 and a second partition PT2. The first partition PT1 may be formed to overlap the transistor TR. The second partition PT2 may be formed to be spaced apart from the first partition PT1.

Figure 12:
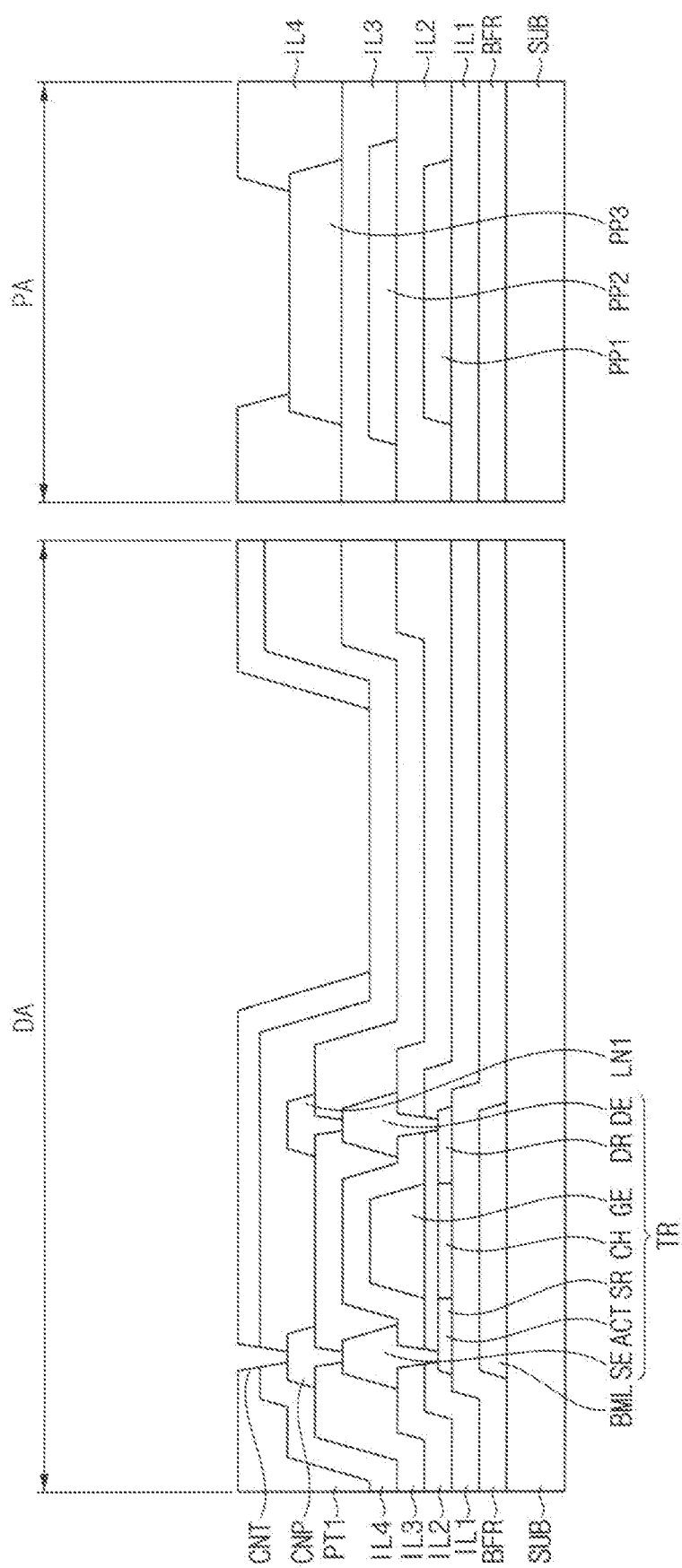

Referring to FIG. 12, a contact hole CNT may be formed in the fourth insulation layer IL4 and the partition PT in the display area DA. The contact hole CNT may be an opening passing through the fourth insulation layer IL4 and the partition PT. A portion of the connection pattern CNP may be exposed due to the contact hole CNT.

A contact hole CNT may be formed in the fourth insulation layer IL4 in the pad area PA. Accordingly, a portion of the third pad pattern PP3 may be exposed due to the contact hole CNT.

Figure 13:
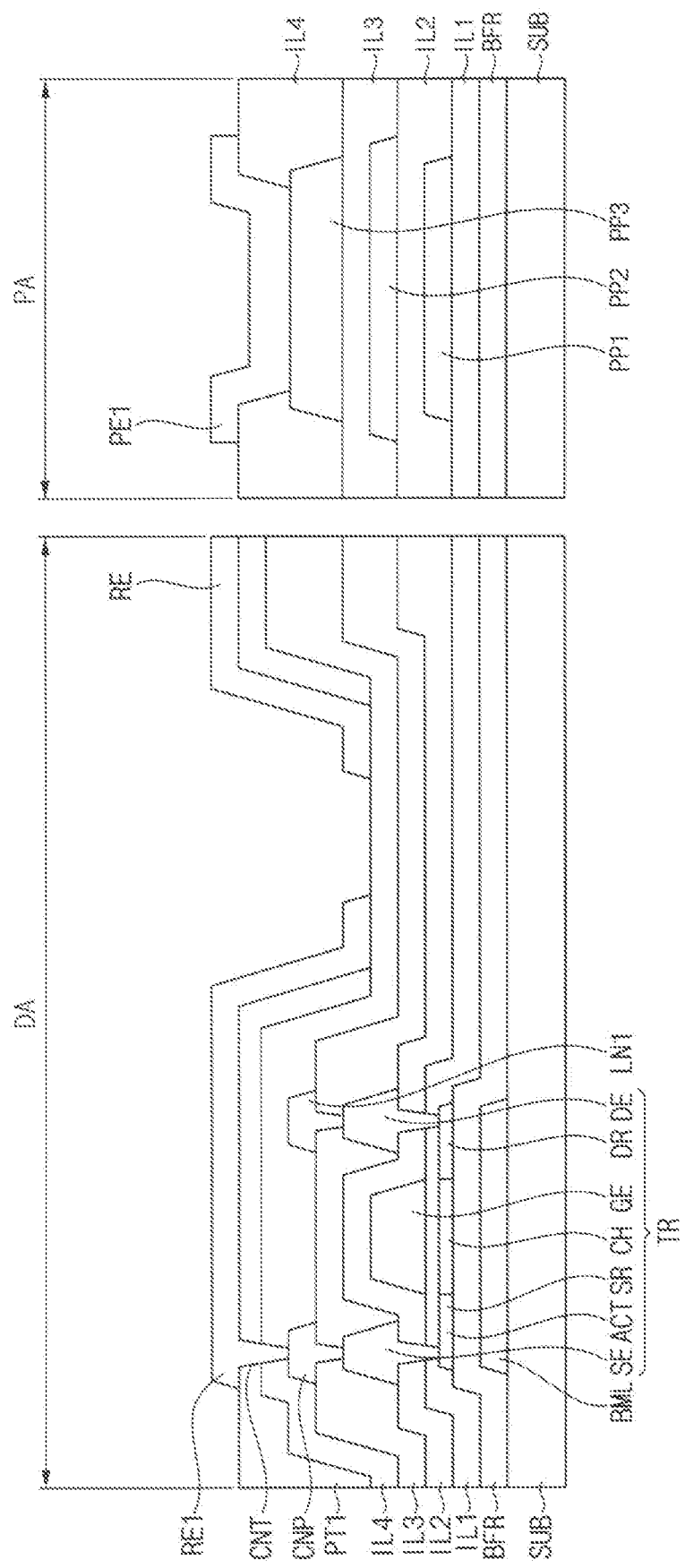

Referring to FIG. 13, in an embodiment, the reflective electrode RE may be formed on the partition PT. The reflective electrode RE may be formed in the display area DA.

The reflective electrode RE may include molybdenum (Mo). Accordingly, chemical resistance of the reflective electrode RE may be improved.

The reflective electrode RE may include a first reflective electrode RE1 and a second reflective electrode RE2. The first reflective electrode RE1 and the second reflective electrode RE2 may be formed to be spaced apart from each other. One end of each of the first reflective electrode RE1 and the second reflective electrode RE2 may electrically contact the fourth insulation layer IL4. The first reflective electrode RE1 may electrically contact the connection pattern CNP through the contact hole CNT formed in the fourth insulation layer IL4 and the first partition PT1. Accordingly, the first reflective electrode RE1 and the transistor TR may be electrically connected.

A first pad electrode PE1 may be formed on the fourth insulation layer IL4 in the pad area PA. The first pad electrode PE1 may be formed in the contact hole formed in the fourth insulation layer IL4. The first pad electrode PE1 and the third pad pattern PP3 may electrically contact each other through the contact hole.

The first pad electrode PE1 may include molybdenum (Mo). Accordingly, chemical resistance of the first pad electrode PE1 may be improved.

The reflective electrode RE and the first pad electrode PE1 may include a same material and may be formed substantially simultaneously.

Figure 14:
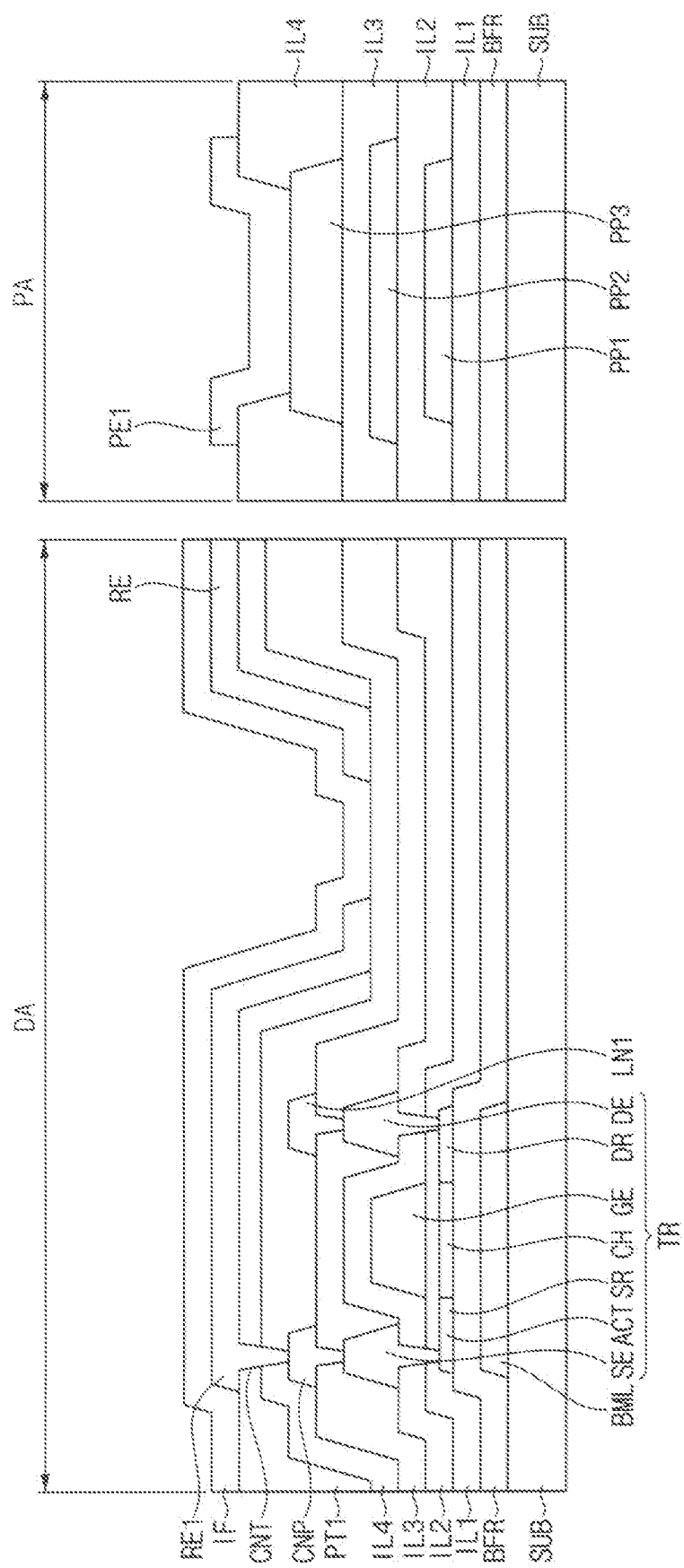

Referring to FIGS. 4 and 14, in an embodiment, an insulating film IF may be formed on the partition PT to cover the reflective electrode RE. The insulating film IF may be formed in the display area DA.

The insulating film IF may include thin film layers TFL having a structure with a first thin film TF1 and a second thin film TF2 stacked. A first thin film TF1 may be formed on the reflective electrode RE. A second thin film TF2 may be formed on the first thin film TF1. Accordingly, the thin film layer TFL including the first thin film TF1 and the second thin film TF2 may be formed. The insulating film IF may be formed in a structure in which the thin film layers TFL with the first thin film TF1 and the second thin film TF2 alternately stacked with five or more layers. The insulating film IF may be formed by stacking five or more thin film layers TFL.

In an embodiment, the insulating film IF may be formed by a sputtering method. For example, the first thin film TF1 and the second thin film TF2 may be sequentially stacked through the sputtering method. Accordingly, manufacturing cost of the insulating film IF may be reduced compared to the conventional insulating film.

In an embodiment, the first thin film TF1 may have a first refractive index, and the second thin film TF2 may have a second refractive index. The first refractive index may be greater than the second refractive index. For example, the first refractive index may be about 2.0 or more, and the second refractive index may be about 1.8 or less. When the first refractive index is about 2.0 or less and the second refractive index is about 1.8 or more, a difference between the first refractive index and the second refractive index may be small. Accordingly, the first thin film TF1 and the second thin film TF2 may be difficult to function as a stacked structure of the low refractive index thin film and the high refractive index thin film.

In an embodiment, the first thin film TF1 may be consist of at least one of niobium pentoxide ($Nb_2O_5$), titanium dioxide ($TiO_2$), and zirconium dioxide ($ZrO_2$). The second thin film TF2 may be consist of at least one of aluminum oxide ($Al_2O_3$) and magnesium fluoride ($MgF_2$). However, embodiments according to the disclosure are not limited thereto, and in other embodiment, the first thin film TF1 may be formed of a material having a refractive index of about 2.0 or more suitable for sputtering. Similarly, the second thin film TF2 may be formed of a material having a refractive index of about 1.8 or less suitable for sputtering.

In an embodiment, a thickness t2 of the first thin film TF1 may be formed to be about 200 Å or more and about 800 Å or less. In an embodiment, a thickness t3 of the second thin film TF2 may be about 1000 Å or less.

Figure 15:
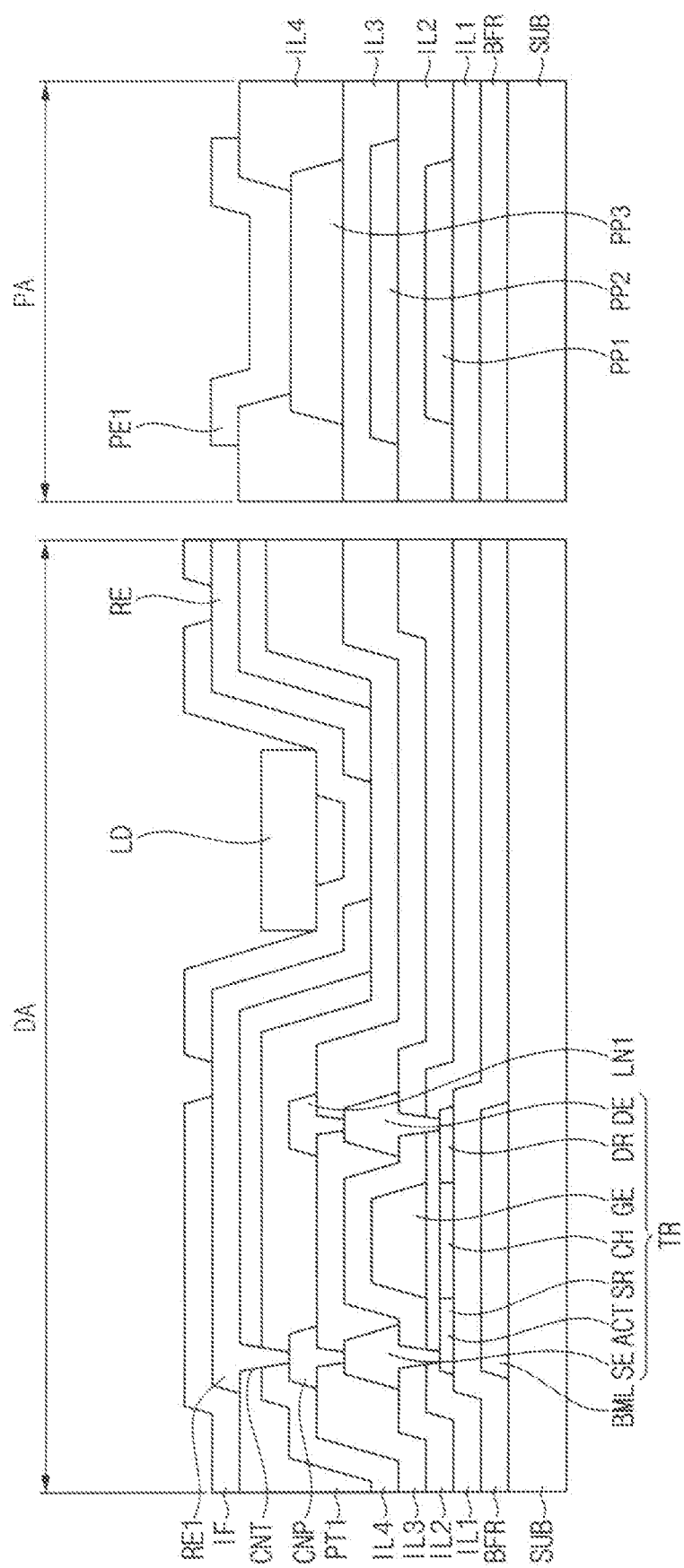
Figure 16:
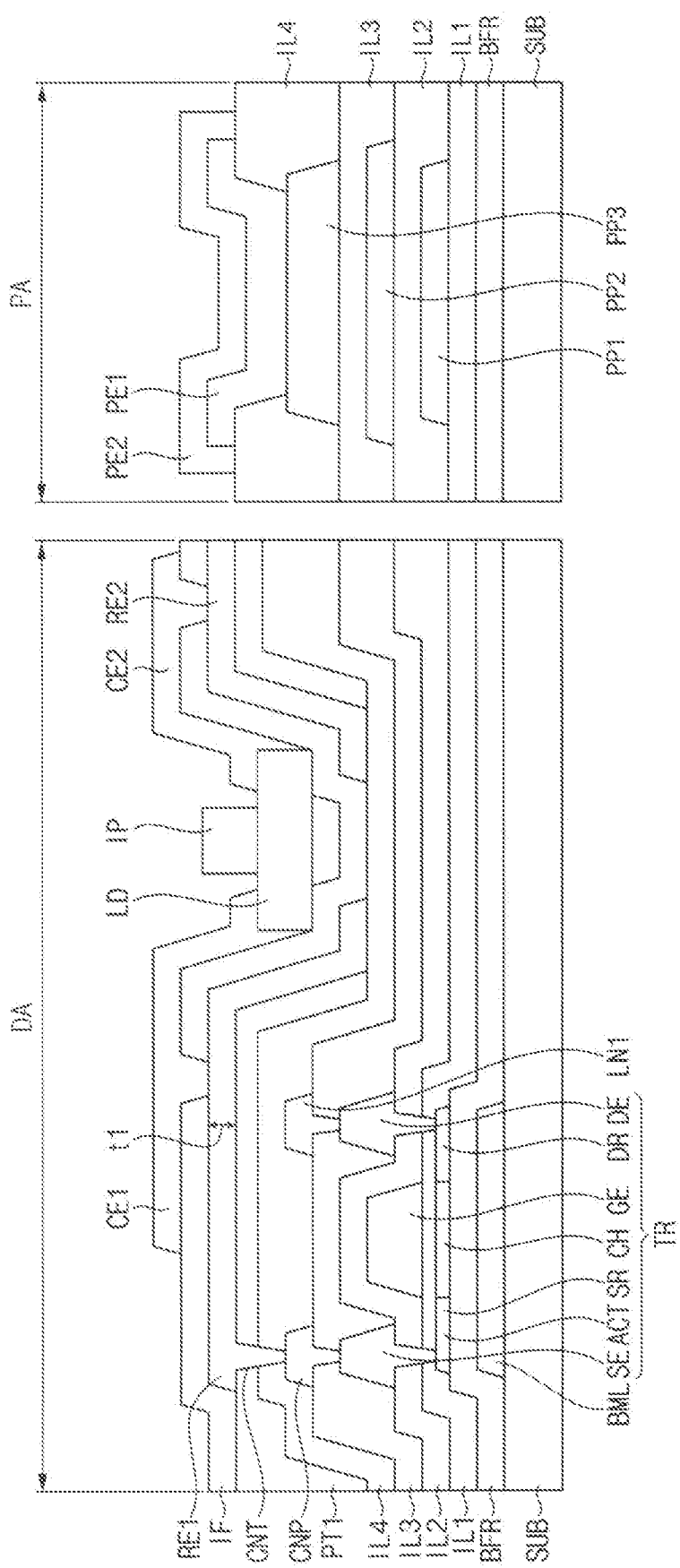

Referring to FIGS. 15 and 16, the light emitting diode LD may be formed on the insulating film IF. The light emitting diode LD and the insulating pattern IP may be formed in the display area DA.

A contact hole may be formed in the insulating film IF in the display area DA. A portion of the reflective electrode RE may be exposed through the contact hole.

A contact electrode CE may be formed on the insulating film IF. The contact electrode CE may be formed in the display area DA. The contact electrode CE may be formed in the contact hole formed in the insulating film IF. The contact electrode CE and the reflective electrode RE may electrically contact each other through the contact hole.

The contact electrode CE may include a first contact electrode CE1 and a second contact electrode CE2. The first contact electrode CE1 may overlap the transistor TR. The second contact electrode CE2 may face the first contact electrode CE1 with the light emitting diode LD interposed there between.

Each of the first contact electrode CE1 and the second contact electrode CE2 may contact both ends of the light emitting diode LD and may be electrically connected to the light emitting diode LD.

In the pad area PA, a second pad electrode PE2 may be formed on the first pad electrode PE1 to cover the first pad electrode PE1. The second pad electrode PE2 may be formed in the pad area PA.

The contact electrode CE and the second pad electrode PE2 may include a same material and may be formed substantially simultaneously. The contact electrode CE and the second pad electrode PE2 may be consist of a transparent conductive material. Examples of the transparent conductive material forming the contact electrode CE and the second pad electrode PE2 may include indium tin oxide (ITO), indium zinc oxide (IZO), indium tin zinc oxide (ITZO), etc. The above materials may be used alone or in combination.

An insulating pattern IP may be formed on the light emitting diode LD. The insulating pattern IP may be formed between the first contact electrode CE1 and the second contact electrode CE2.

In an embodiment, by forming the insulating film IF by a sputtering method, the manufacturing cost of the insulating film IF may be reduced. Accordingly, manufacturing cost of the display device 10 may be reduced.

The display device and the method according to the embodiments may be applied to a display device included in a computer, a notebook, a mobile phone, a smartphone, a smart pad, a PMP, a PDA, an MP3 player, or the like.

Although the display device and the method according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device comprising:
    a substrate including a display area and a non-display area adjacent to the display area;
    a transistor disposed in the display area of the substrate and on the substrate, the transistor including an active pattern, a gate electrode, a source electrode, and a drain electrode;
    a reflective electrode disposed on the transistor and electrically connected to the transistor, the reflective electrode including molybdenum (Mo);
    an insulating film disposed on the reflective electrode and including at least one thin film layer, the at least one thin film layer including:
        a first thin film including a material having a refractive index of 2.0 or more; and
        a second thin film disposed on the first thin film and including a material having a refractive index of 1.8 or less;
    a contact electrode disposed on the insulating film and electrically connected to the reflective electrode; and
    a light emitting diode disposed on the insulating film and electrically connected to the contact electrode.

2. The display device of claim 1, wherein
    the first thin film includes at least one of niobium pentoxide ($Nb_2O_5$), titanium dioxide ($TiO_2$), and zirconium dioxide ($ZrO_2$), and
    the second thin film includes at least one of aluminum oxide ($Al_2O_3$) and magnesium fluoride ($MgF_2$).

3. The display device of claim 1, wherein
    the reflective electrode is spaced apart from the transistor,
    the insulating film directly contacts the light emitting diode, and
    a portion of the contact electrode is disposed directly above the light emitting diode and is made of a transparent conductive material.

4. The display device of claim 1, wherein
    the at least one thin film layer includes at least five thin film layers, and
    the insulating film includes the at least five thin film layers stacked each other.

5. The display device of claim 1, wherein
    a thickness of the first thin film is less than about 1000 Å, and
    a thickness of the second thin film is in a range of about 200 Å and about 800 Å.

6. The display device of claim 1, wherein a thickness of the reflective electrode is in a range of about 500 Å and about 4000 Å.

7. The display device of claim 1, wherein the contact electrode includes at least one of indium tin oxide (ITO), indium zinc oxide (IZO), and indium tin zinc oxide (ITZO).

8. The display device of claim 1, further comprising:
    a pad disposed in the non-display area of the substrate and on the substrate.

9. The display device of claim 8, wherein the pad includes:
    a first pad electrode including molybdenum; and
    a second pad electrode covering the first pad electrode and disposed on the first pad electrode.

10. The display device of claim 9, wherein the first pad electrode and the reflective electrode include a same material.

11. The display device of claim 9, wherein the second pad electrode and the contact electrode include a same material.

12. The display device of claim 1, wherein
    the contact electrode includes a first contact electrode and a second contact electrode spaced apart from the first contact electrode, and
    the light emitting diode is disposed between the first contact electrode and the second contact electrode.

13. The display device of claim 12, further comprising:
    an insulation pattern disposed on the light emitting diode, wherein
    the insulation pattern is disposed between the first contact electrode and the second contact electrode.

14. A method of manufacturing a display device, the method comprising:
    providing a substrate including a display area and a non-display area adjacent to the display area;
    forming a transistor on the substrate and in the display area of the substrate, the transistor including an active pattern, a gate electrode, a source electrode, and a drain electrode;
    forming a reflective electrode on the transistor, the reflective electrode electrically connecting with the transistor, and including molybdenum (Mo);
    forming an insulating film on the reflective electrode by stacking at least one thin film layer, the at least one thin film layer including a first thin film including a material having a refractive index of 2.0 or more, and a second thin film formed on the first thin film and including a material having a refractive index of 1.8 or less;
    forming a light emitting diode on the insulating film; and
    forming a contact electrode on the second thin film, the contact electrode electrically connecting with the reflective electrode and the light emitting diode.

15. The method of claim 14, wherein the first thin film includes at least one of niobium pentoxide ($Nb_2O_5$), titanium dioxide ($TiO_2$), and zirconium dioxide ($ZrO_2$).

16. The method of claim 14, wherein the second thin film includes at least one of aluminum oxide ($Al_2O_3$) and magnesium fluoride ($MgF_2$).

17. The method of claim 14, wherein the first thin film and the second thin film are formed by a sputtering method.

18. The method of claim 14, wherein
    a thickness of the first thin film is less than about 1000 Å, and
    a thickness of the second thin film is in a range of about 200 Å and about 800 Å.

19. The method of claim 14, further comprising:
    forming a first pad electrode on the substrate and in the non-display area of the substrate and forming a second pad electrode on the first pad electrode.

20. The method of claim 19, wherein
the first pad electrode and the reflective electrode are formed simultaneously, and
the second pad electrode and the contact electrode are formed simultaneously.

\* \* \* \* \*